(12) United States Patent
Chuang et al.

(10) Patent No.: US 11,283,009 B2
(45) Date of Patent: Mar. 22, 2022

(54) METHOD FOR MANUFACTURING MEMORY DEVICE HAVING PROTECTION SPACER

(71) Applicant: TAIWAN SEMICONDUCTOR MANUFACTURING CO., LTD., Hsinchu (TW)

(72) Inventors: Harry-Hak-Lay Chuang, Hsinchu County (TW); Chun-Heng Liao, New Taipei (TW); Jun-Yao Chen, Taoyuan (TW); Hung-Cho Wang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/702,137

(22) Filed: Dec. 3, 2019

(65) Prior Publication Data

US 2021/0098693 A1 Apr. 1, 2021

Related U.S. Application Data

(60) Provisional application No. 62/906,606, filed on Sep. 26, 2019.

(51) Int. Cl.
| | | |
|---|---|---|
| *H01L 43/08* | (2006.01) | |
| *G11C 11/16* | (2006.01) | |
| *H01L 43/12* | (2006.01) | |
| *H01L 27/22* | (2006.01) | |

(52) U.S. Cl.
CPC ............ *H01L 43/08* (2013.01); *G11C 11/161* (2013.01); *H01L 27/222* (2013.01); *H01L 43/12* (2013.01)

(58) Field of Classification Search
CPC ....... H01L 43/08; H01L 27/222; H01L 43/12; G11C 11/161
See application file for complete search history.

(56) References Cited

U.S. PATENT DOCUMENTS

| | | | |
|---|---|---|---|
| 2015/0069480 A1* | 3/2015 | Kanaya | G11C 11/16 257/295 |
| 2015/0102006 A1* | 4/2015 | Mudivarthi | G11C 11/161 216/11 |
| 2016/0035969 A1* | 2/2016 | Kang | H01L 43/08 257/421 |
| 2018/0248115 A1* | 8/2018 | Oguz | H01L 43/08 |
| 2019/0088864 A1* | 3/2019 | Cho | H01L 27/228 |
| 2019/0207105 A1* | 7/2019 | Boone | H01L 43/10 |
| 2020/0098977 A1* | 3/2020 | Kim | H01L 43/12 |
| 2020/0105829 A1* | 4/2020 | Boone | H01L 43/12 |
| 2020/0212292 A1* | 7/2020 | Cheng | H01L 43/12 |
| 2020/0328251 A1* | 10/2020 | Dutta | H01L 23/53209 |

(Continued)

*Primary Examiner* — Douglas W Owens
(74) *Attorney, Agent, or Firm* — Maschoff Brennan

(57) ABSTRACT

A method for manufacturing a memory device is provided. The method includes forming a bottom electrode layer, a resistance switching element layer over the bottom electrode layer, and a top electrode layer over the resistance switching element layer; patterning the top electrode layer into a top electrode; forming a protection spacer on a sidewall of the top electrode; patterning the resistance switching element layer into a resistance switching element after forming the protection spacer; and patterning the bottom electrode layer into a bottom electrode after patterning the resistance switching element layer.

20 Claims, 14 Drawing Sheets

(56) References Cited

U.S. PATENT DOCUMENTS

| | | | |
|---|---|---|---|
| 2021/0035620 A1* | 2/2021 | Wang | H01L 43/10 |
| 2021/0083178 A1* | 3/2021 | Hsu | H01L 43/10 |
| 2021/0091306 A1* | 3/2021 | Dutta | H01L 43/02 |
| 2021/0343930 A1* | 11/2021 | Hsu | H01L 43/02 |

* cited by examiner

METHOD FOR MANUFACTURING MEMORY DEVICE HAVING PROTECTION SPACER

PRIORITY CLAIM AND CROSS-REFERENCE

This application claims priority to U.S. Provisional Application Ser. No. 62/906,606, filed Sep. 26, 2019, which is herein incorporated by reference.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
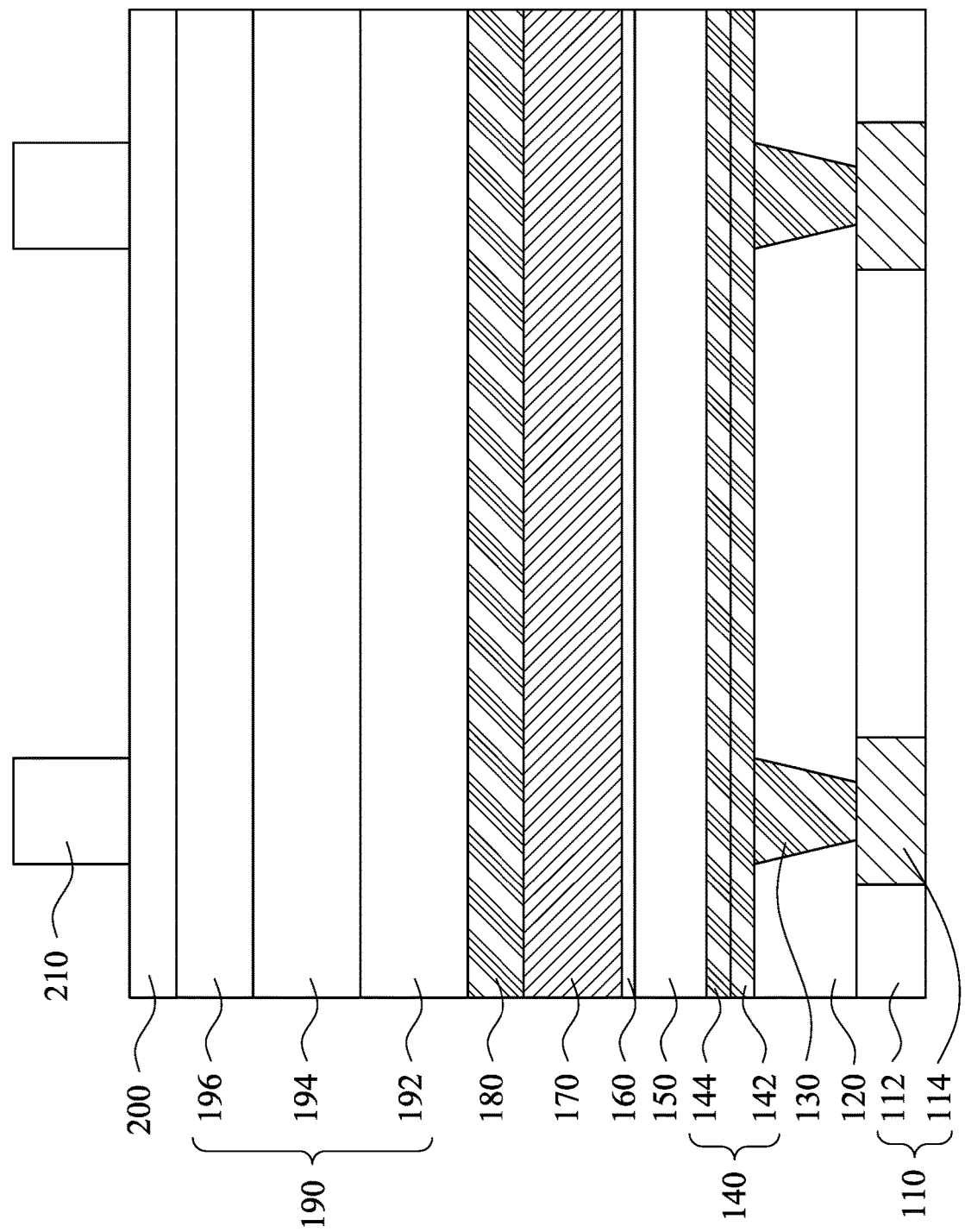
FIGS. 1 through 12 illustrate a memory device at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic random-access memory (MRAM) device and the method of forming the same are provided in accordance with various exemplary embodiments. The intermediate stages of forming the MRAM device are illustrated. The variations of the embodiments are discussed. Throughout the various views and illustrative embodiments, like reference numbers are used to designate like elements.

The mechanism for dry etching can be through chemical reactions that consume the material using chemically reactive gas plasmas, physical removal that removes the material by momentum transfer between gas molecules, or a combination of both physical removal and chemical reactions. Plasma etching is an example of a pure chemical dry etching technique. On the other hand, physical sputtering and ion beam etching are examples of pure physical dry etching techniques. Reactive ion etching (RIE) is an example of dry etching that employs both physical and chemical processes.

Embodiments of the disclosure include manufacturing methods using ion beam etching (IBE) to fabricate a memory element for an MRAM cell. In the embodiments, a top electrode layer is etched with one mask using reactive etching such as RIE, then the magnetic tunnel junctions (MTJ) layer and the bottom electrode layer are etched using magnetized inductively coupled plasma (MICP) and IBE respectively, in which a protection spacer is formed to cover a sidewall of the top electrode prior to the MICP and the IBE. The MICP and the IBE respectively etches the MTJ layer and the bottom electrode without an additional mask. This makes the MTJ stack and the bottom electrode self-aligned to the top electrode and the protection spacer, thereby saving masks. The IBE process may also remove damaged portions and oxidized portions of the MTJ sidewalls caused during the MICP or by exposing the MTJ sidewall to the atmosphere, thereby achieving MTJ sidewall cleaning without the need for an additional step. In the embodiments, the protection spacer protects the sidewall of the top electrode, thereby avoiding a conductive material of the top electrode from being re-deposited on a sidewall of the MTJ stack during the IBE process.

FIGS. 1 through 12 illustrate a memory device at various stages of fabrication in accordance with some embodiments of the present disclosure. FIG. 1 illustrates a wafer having a substrate 110 thereon. The substrate 110 includes an interlayer dielectric (ILD) layer or inter-metal dielectric (IMD) layer 112 with a metallization pattern 114. The ILD layer 112 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 114 may be aluminum, aluminum alloy, copper, copper alloy, titanium, titanium nitride, tantalum, tantalum nitride, tungsten, cobalt, the like, and/or combinations thereof. Formation of the metallization pattern 114 and the ILD layer 112 may be a dual-damascene process and/or a single-damascene process. The substrate 110 may also include active and passive devices, for example, underlying the ILD layer 112. The substrate 110 may also include suitable semiconductor base substrate supporting the active and passive devices. These further components are omitted from the figures for clarity.

A dielectric layer 120 is formed over the substrate 110. The dielectric layer 120 in some embodiments is silicon carbide (SiC), silicon oxynitride (SiON), silicon nitride (SiN), silicon dioxide, the like, and/or combinations thereof. The dielectric layer 120 may be a single-layered structure or a multi-layered structure. The dielectric layer 120 may be formed by acceptable deposition techniques, such as chemical vapor deposition (CVD), atomic layer deposition (ALD), physical vapor deposition (PVD), the like, and/or a combination thereof.

Bottom electrode vias (BEVA) 130 are then formed in the dielectric layer 120. An exemplary formation method of the BEVAs 130 includes etching openings in the dielectric layer 120 to expose portions of the metallization pattern 114, overfilling the openings in the dielectric layer 120 with a fill metal, and performing a planarization process, such as a chemical-mechanical polish (CMP) process, to remove excess materials of the fill metal outside the openings in the dielectric layer 120. The remaining fill metal in the openings in the dielectric layer 120 can serve as the BEVAs 130. In some embodiments, the BEVAs 130 are electrically connected to an underlying electrical component, such as a transistor, through the metallization pattern 114.

In some embodiments, at least one of the BEVAs 130 is a multi-layered structure and includes, for example, a diffusion barrier layer and a filling metal filling a recess in the diffusion barrier layer. In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or a combination thereof. In some embodiments, the filling metal is titanium (Ti), tantalum (Ta), platinum (Pt), ruthenium (Ru), tungsten (W), aluminum (Al), copper (Cu), TiN, TaN, the like, and/or combinations thereof. Formation of the filling metal may be exemplarily performed using CVD, PVD, ALD, the like, and/or a combination thereof.

A blanket bottom electrode layer 140 is then formed over the BEVAs 130 and over the dielectric layer 120, so that the bottom electrode layer 140 extends along top surfaces of the BEVAs 130 and of the dielectric layer 120. In some embodiments, the bottom electrode layer 140 may include titanium (Ti), tantalum (Ta), platinum (Pt), ruthenium (Ru), tungsten (W), aluminum (Al), copper (Cu), TiN, TaN, the like, and/or a combination thereof. The bottom electrode layer 140 can be a single-layered structure or a multi-layered structure. For example, the bottom electrode layer 140 may include a first electrode layer 142 and a second electrode layer 144 over the first electrode layer 142, in which the first electrode layer 142 includes TaN, and the second electrode layer 144 includes TiN. Formation of the bottom electrode layer 140 may be exemplarily performed using CVD, PVD, ALD, the like, and/or a combination thereof.

A resistance switching layer 150 is formed over the bottom electrode layer 140. In some embodiments, the resistance switching layer 150 may be a magnetic tunnel junction (MTJ) structure. To be specific, the resistance switching layer 150 includes at least a first magnetic layer, a tunnel barrier layer and a second magnetic layer formed in sequence over the bottom electrode layer 140.

In some embodiments, the first magnetic layer includes an anti-ferromagnetic material (AFM) layer over the bottom electrode layer 140 and a ferromagnetic pinned layer over the AFM layer. In the AFM layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD, e-beam or thermal evaporation, or the like.

The ferromagnetic pinned layer in the first magnetic layer forms a permanent magnet and exhibits strong interactions with magnets. A direction of a magnetic moment of the ferromagnetic pinned layer can be pinned by the AFM layer and is not changed during operation of a resulting resistance switching element (e.g. a MTJ stack) fabricated from the resistance switching layer 150. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, e-beam or thermal evaparation, or the like. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element (e.g. a MTJ stack) fabricated from the resistance switching layer 150. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer includes sputtering, PVD, ALD, e-beam or thermal evaporation, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron. An exemplary formation method of the second magnetic layer includes sputtering, PVD, ALD, e-beam or thermal evaporation, or the like.

In some embodiments where the method is applicable to a manufacturing process of resistive random access memory (RRAM) cells, the resistance switching layer 150 may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide (TaO$_x$), or titanium oxide (TiO$_x$) as in its relative high resistance state and a metal such as titanium (Ti), hafnium (Hf), platinum (Pt), ruthenium (Ru), and/or aluminum (Al) as in its relative low resistance state.

A capping layer 160 is formed over the resistance switching layer 150. The capping layer 160 may protect the resistance switching layer 150 from oxidation during fabrication process. The capping layer 160 may be a thin metal layer, such as a ruthenium (Ru) layer. The capping layer 160 may be deposited by PVD, ALD, e-beam or thermal evaporation, or the like.

A top electrode layer 170 is formed over the capping layer 160. The top electrode layer 170 includes a conductive material. In some embodiments, the top electrode layer 170 may include a metal, such as tungsten (W), titanium (Ti), tantalum (Ta), platinum (Pt), ruthenium (Ru), aluminum (Al), copper (Cu), the like or combinations thereof. An exemplary formation method of the top electrode layer 170 includes sputtering, PVD, or the like.

A metal-containing compound mask layer 180 is formed over the top electrode layer 170 in sequence. In some embodiments, the metal-containing compound mask layer 180 is formed from a metal-containing compound material. For example, the metal-containing compound mask layer 180 may include a metal nitride (e.g., titanium nitride (TiN)), the like, and/or combinations thereof. The metal-containing compound mask layer 180 may be formed by acceptable deposition techniques, such as CVD, ALD, PVD, the like, and/or combinations thereof.

A hard mask layer 190 is formed over the metal-containing compound mask layer 180 in sequence. In some embodiments, the hard mask layer 190 is formed of a dielectric material. For example, the hard mask layer 190 may be include silicon carbide (SiC), silicon oxynitride (SiON), silicon nitride (SiN), silicon dioxide (SiO$_2$), ashing removable dielectric (ARD), the like, and/or combinations thereof. The hard mask layer 190 may be a multi-layer structure, for example, including layers 192-196. The layers 192 and 196 may include silicon oxynitride (SiON), and the layer 194 may include a material different from that of the layers 192 and 196. For example, the layer 194 may be an amorphous carbon hard mask film including amorphous carbon. In some embodiments, the layer 194 may be referred to as the advanced patterning film (APF). The layers of the hard mask layer 190 may be formed by acceptable deposition techniques, such as CVD, ALD, PVD, the like, and/or combinations thereof.

A bottom anti-reflection coating (BARC) 200 is formed over the hard mask layer 190, and then a patterned resist layer 210 is formed over the BARC 200. In some embodiments, a resist layer (e.g., photoresist) is formed over the BARC 200 and patterned using suitable photolithography process, thereby forming the patterned resist layer 210. For example, the process may include photoresist coating (e.g., spin-on coating), soft baking, mask aligning, exposure, post-exposure baking, developing the photoresist, rinsing, drying (e.g., hard baking), other suitable processes, or combinations thereof. In some embodiments, the patterned resist layer 210 is an ashing removable dielectric (ARD), which is a photoresist-like material generally having generally the properties of a photoresist and amendable to etching and patterning like a photoresist. The BARC 200 reduces reflection of light during a lithography process to increase the precision of patterns formed in resist layer 210. The BARC 200 may also acts as a mask layer for patterning underlying layers in some embodiments. In some embodiments, the BARC 200 includes an organic material, such as polymer. In some embodiments, the BARC 200 includes SiON. The BARC 200 may be formed by spin-on coating, CVD, PVD, ALD, or other suitable processes.

Figure 2:
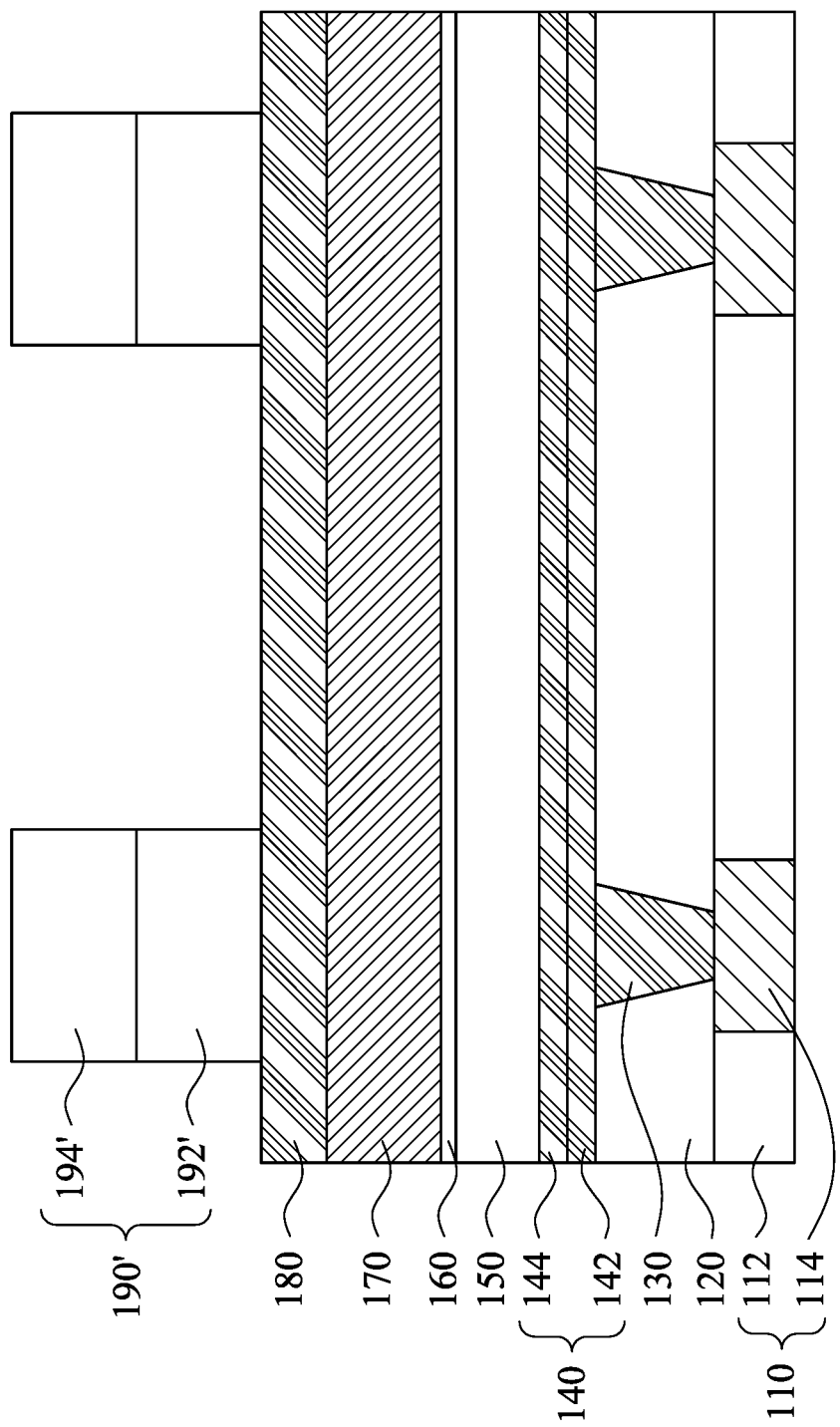

Reference is made to FIG. 2. The layers 192 and 194 (referring to FIG. 1) are etched through the patterned resist layer 210 (referring to FIG. 1) by a suitable etching process, thereby respectively patterned into hard masks 192' and 194', which are in combination referred to as a hard mask 190' hereinafter. The etching process may be a dry etch using fluoride-based etchants, such as CF$_4$. The metal-containing compound mask layer 180 may have a higher etch resistance to the etchants than that of the layers 192 and 194 of the hard mask layer 190 (referring to FIG. 1), thereby protecting underlying layers from being etched. After the etching process, the hard mask 190' expose portions of the metal-containing compound mask layer 180. In some embodiments, the patterned resist layer 210, the BARC 200, and the layer 196 of the hard mask layer 190 (referring to FIG. 1) may be consumed and removed by the etching process.

Figure 3:
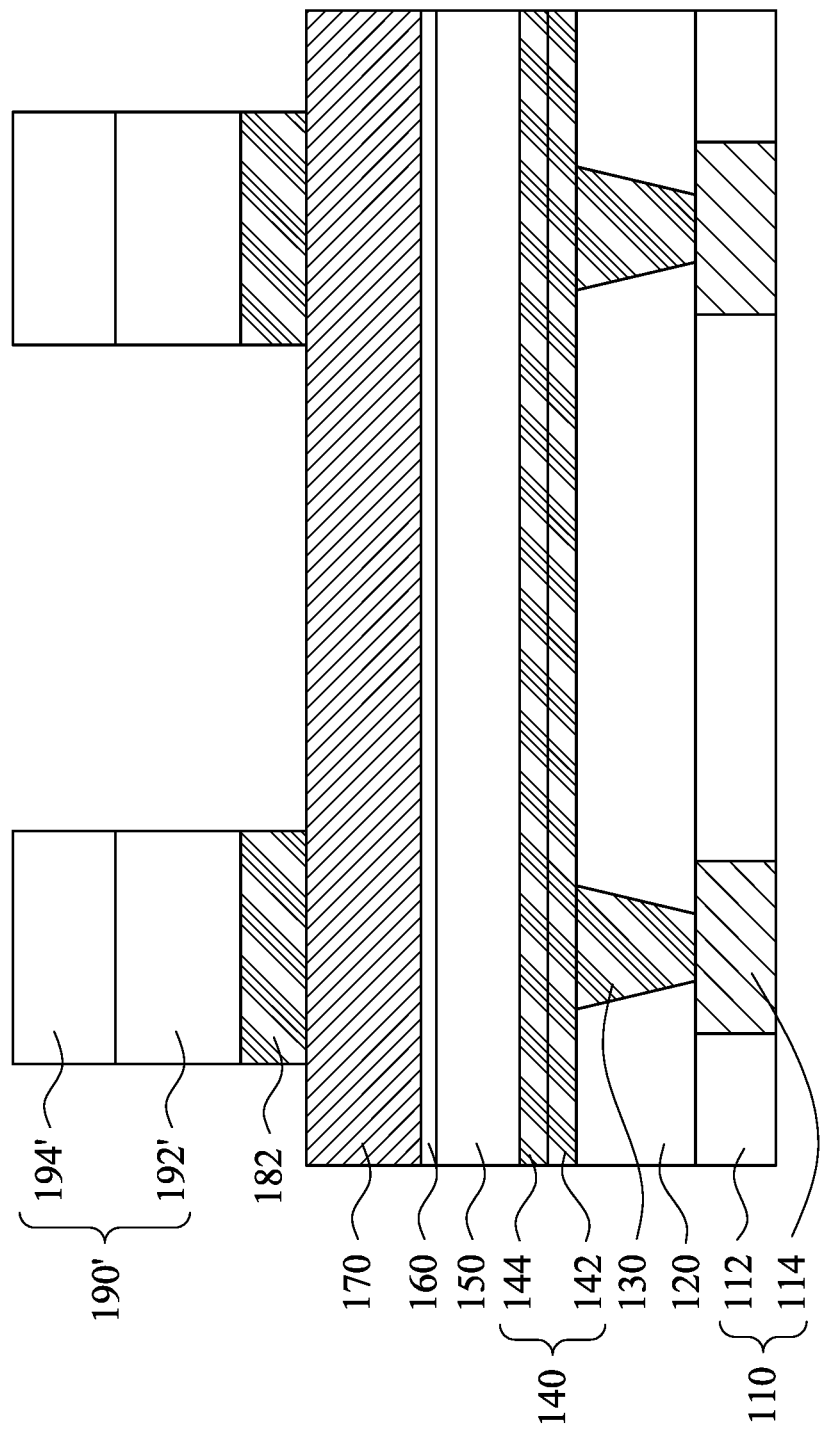

Reference is made to FIG. 3. The metal-containing compound mask layer 180 is patterned into metal-containing compound masks 182 by suitable etching process. For example, the etching process may include a physical etching process, such as an ion-beam etching (IBE) process. The IBE process may etch and remove portions of the metal-containing compound mask layer 180 (referring to FIG. 2) exposed by the hard mask 190', while other portions of the metal-containing compound mask layer 180 (referring to FIG. 2) covered by the hard mask 190' are protected from being etched during the IBE process by the hard mask 190'. The IBE process may be operated with an incident angle (i.e., angle between the ion beam direction and a line normal to the plane of the substrate 110) in a range from about 0 degree to about 10 degrees for vertical etch. The IBE process may have an end point detection system to allow the etching process to stop on the top electrode layer 170. After the IBE process, the metal-containing compound masks 182 expose portions of the top electrode layer 170. In some embodiments, the layer 194' may be consumed and thinned by the IBE process.

Figure 4:
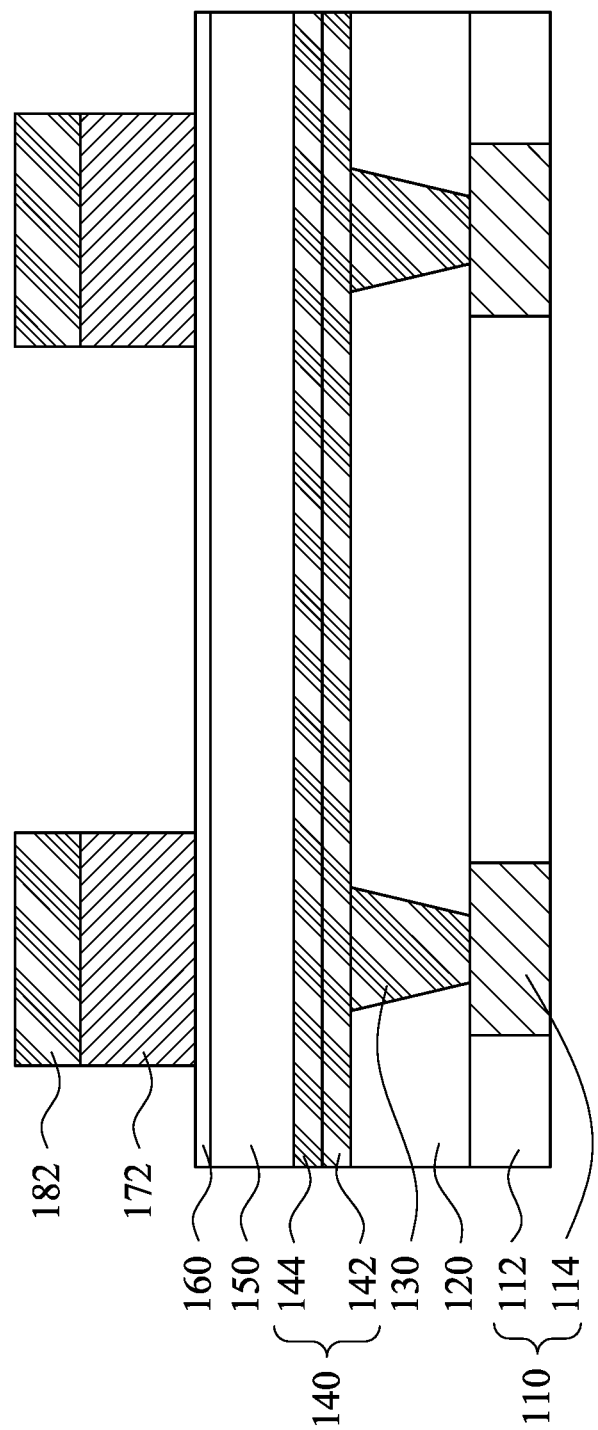

Reference is made to FIG. 4. The top electrode layer 170 (referring to FIG. 3) is patterned into top electrodes 172 by a suitable etching process, thereby exposing portions of the capping layer 160. The etching process may be a dry etch that employs both physical and chemical processes, such as RIE. The dry etch may use fluoride-based etchants, such as CF$_4$. After the dry etch, an ashing process may be performed to remove the hard masks 190' (referring to FIG. 3). In some embodiments, the metal-containing compound masks 182 has a higher etch resistance to the etchants than that of the top electrode layer 170 (referring to FIG. 3), thereby serving as an etch mask protecting underlying portions of the top electrode layer 170 (referring to FIG. 3) from being etched during the dry etch. For example, the dry etch may etch and remove portions of the top electrode layer 170 (referring to FIG. 3) exposed by the metal-containing compound masks 182, while other portions of the top electrode layer 170 (referring to FIG. 3) covered by the metal-containing compound masks 182 are protected from being etched during the dry etch. In some embodiments, the capping layer 160 may have a higher etch resistance to the etchants than that of the top electrode layer 170 (referring to FIG. 3), thereby serving as a etch stop layer during the dry etch process and protecting underlying layers from being etched. After the dry etch process, the top electrodes 172 expose portions of the capping layer 160.

Figure 5:
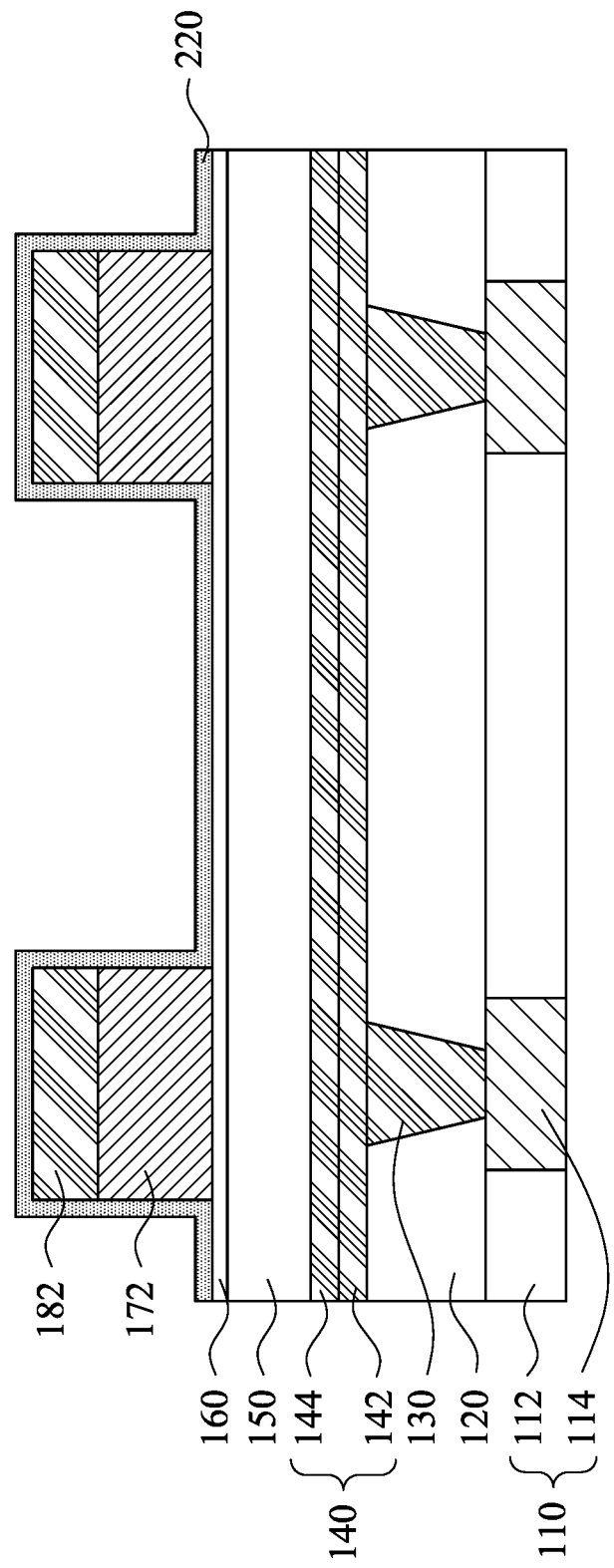

Reference is made to FIG. 5. A protection spacer layer 220 is blanketly deposited over the structure of FIG. 4, and covers the sidewall of the top electrodes 172, the sidewall of the metal-containing compound masks 182, and top surfaces of the metal-containing compound masks 182. In some embodiments, the protection spacer layer 220 includes suitable materials that is less conductive than a material of the top electrode layer 170, such that if a material (e.g., a material of the protection spacer 220) is re-deposited on the sidewall of resistance switching elements (e.g., an MTJ stack) during subsequent physical etching process, the material of the protection spacer 220 may be less likely to short the MTJ structure (i.e., the MTJ stack and top and bottom electrodes). For example, the protection spacer layer 220 may include $AlO_x$, TaN, silicon nitride, or the like. In some embodiments, the material of the protection spacer layer 220 may be less-likely to be re-deposited on the sidewall of resistance switching elements (e.g., an MTJ stack) than a material of the top electrodes 172 (e.g., tungsten) during subsequent physical etching process.

The protection spacer layer 220 may be deposited with a small thickness, for example, in a range from about 50 angstroms to about 100 angstroms. If the thickness of the protection spacer layer 220 is greater than 100 angstroms, thick protection spacers may be formed, and resistance switching elements (e.g., an MTJ stack) subsequently formed may undesirably have large critical dimensions (CD). If the thickness of the protection spacer layer 220 is less than 50 angstroms, the formed protection spacers may be too thinned and broken to protect the sidewall of the top electrodes 172 from being etched in subsequently physical etching process. In some embodiments, the protection spacer layer 220 includes a metal-containing compound material (e.g., $AlO_x$, TaN) that can be formed with the small thickness. For example, in some embodiments, the $AlO_x$ protection spacer layer 220 is deposited by atomic layer deposition. In some embodiments, the TaN protection spacer layer 220 is deposited by physical vapor deposition process.

Figure 6:
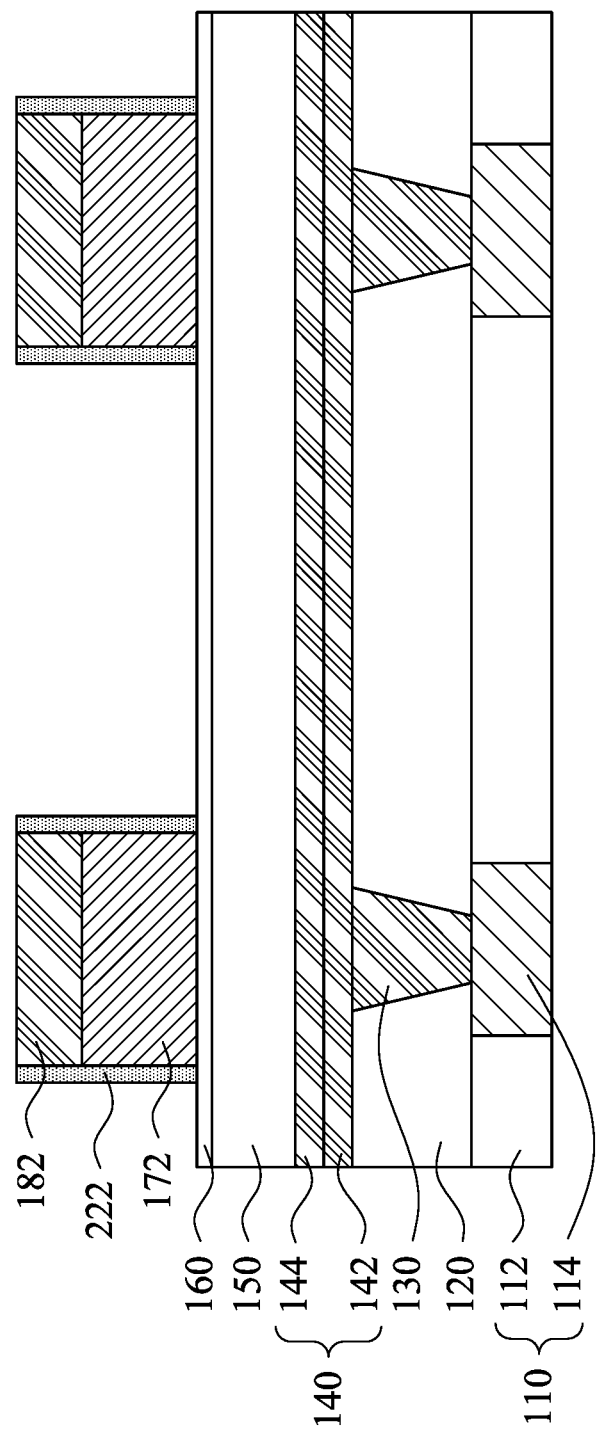

Reference is made to FIG. 6. The protection spacer layer 220 (referring to FIG. 5) is patterned into protection spacers 222 by suitable anisotropic etch process. The anisotropic etching process is performed to remove horizontal portions of the protection spacer layer 220 (referring to FIG. 5) and remaining vertical portions of the protection spacer layer 220 (referring to FIG. 5), which are referred to as protection spacers 222 hereinafter. In some embodiments, the anisotropic etch process may include a physical etching process, such as an IBE process. The IBE process may operate with an incident angle in a range from about 0 degree to about 10 degrees for vertical etching. The IBE process may have an end point detection system to allow the etching process to stop on the capping layer 160 and the metal-containing compound masks 182. In some embodiments where the protection spacers 222 include a dielectric material, such as silicon nitride, the anisotropic etch process may include other dry etching process, such as plasma etching. The capping layer 160 and the metal-containing compound masks 182 may have a higher etch resistance to the dry etching process than that of the protection spacer layer 220 (referring to FIG. 5), thereby protecting underlying layers form being etched.

After the anisotropic etch process, the protection spacers 222 are respectively around the top electrodes 172 and the metal-containing compound masks 182. The protection spacers 222 may respectively protect the sidewalls of the top electrodes 172 from being etched in subsequent etching processes, thereby avoiding tungsten redeposition issues.

Figure 7:
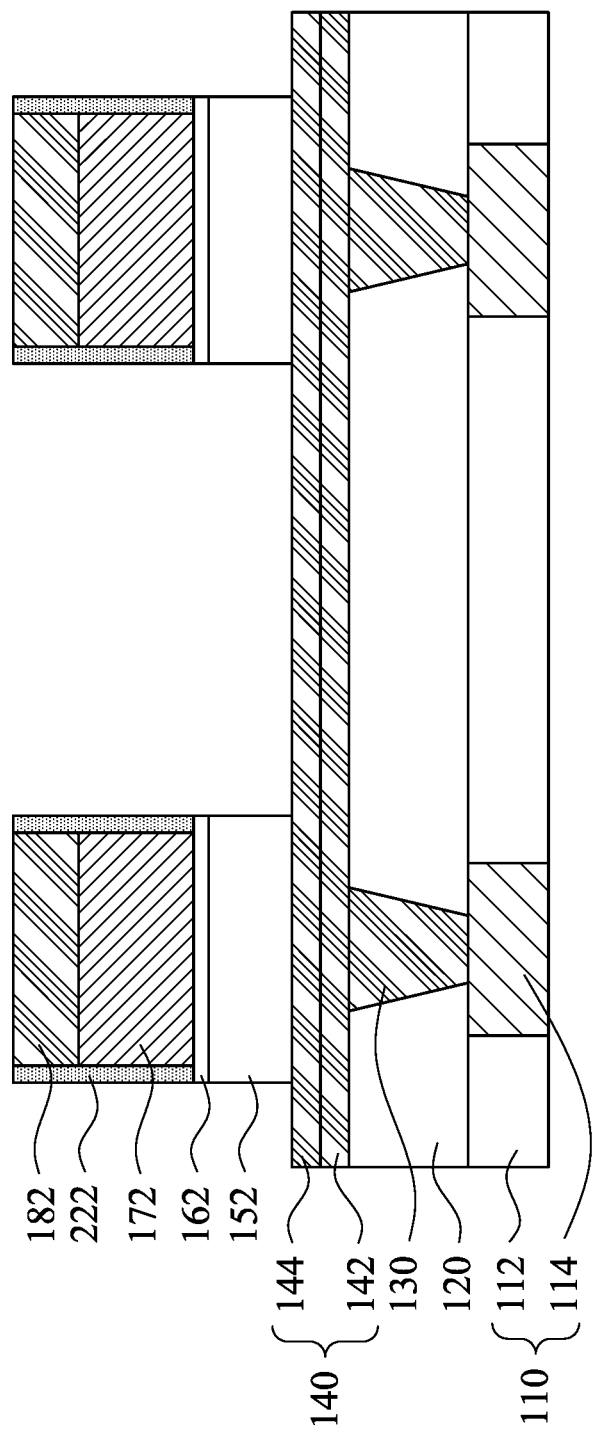

Reference is then made to FIG. 7. The capping layer 160 and underlying resistance switching layer 150 (referring to FIG. 6) are respectively patterned into capping layers 162 and resistance switching elements 152 by a suitable etching process. The etching process may be a chemical etching process, such as magnetized inductively coupled plasma (MICP) etch process. Gases, such as $CH_3OH$, may be used during the chemical etching process. In some embodiments, the metal-containing compound masks 182 may have a higher etch resistance to the chemical etching process than that of the capping layer 160 and the resistance switching layer 150 (referring to FIG. 6), and may serve as an etch mask during the chemical etching process. For example, the chemical etching process removes exposed portions of the capping layer 160 and underlying resistance switching layer 150 (referring to FIG. 6) not protected by the metal-containing compound masks 182, and remaining portions of the capping layer 160 and underlying resistance switching layer 150 (referring to FIG. 6) below the metal-containing compound masks 182, which are referred to as the capping layers 162 and resistance switching elements 152 respectively. To be specific, in some embodiments wherein $CH_3OH$ gas is used, the etch rate of the metal-containing compound masks 182 and the bottom electrode layer 140 (e.g., titanium nitride) in the $CH_3OH$ gas is less than the etch rate of the capping layer 160 and the resistance switching layer 150 in the $CH_3OH$ gas. For example, the etch rate of the metal-containing compound masks 182 and the bottom electrode layer 140 (e.g., titanium nitride) in the $CH_3OH$ gas is less than about 0.5 angstrom/min.

In some embodiments, the bottom electrode layer 140 may have a higher etch resistance to the chemical etching process than that of the capping layer 160 and the resistance switching layer 150 (referring to FIG. 6). The bottom electrode layer 140 may serve as an etch stop layer during patterning the resistance switching layer 150 (referring to FIG. 6) and protect the underlying layers from being etched.

In some embodiments, a material of the protection spacers 222 is chosen to have a higher etch resistance to the chemical etching process than that of the capping layer 160 and the resistance switching layer 150 (referring to FIG. 6), thereby protecting the sidewalls of the top electrodes 172 from being exposed during the etching process. For example, in some embodiments wherein the $CH_3OH$ gas is used, the etch rate of the protection spacers 222 (e.g., AlOx, TaN, or silicon nitride) in the $CH_3OH$ gas is less than the etch rate of the capping layer 160 (e.g., Ru) and the resistance switching layer 150 in the $CH_3OH$ gas.

Figure 8:
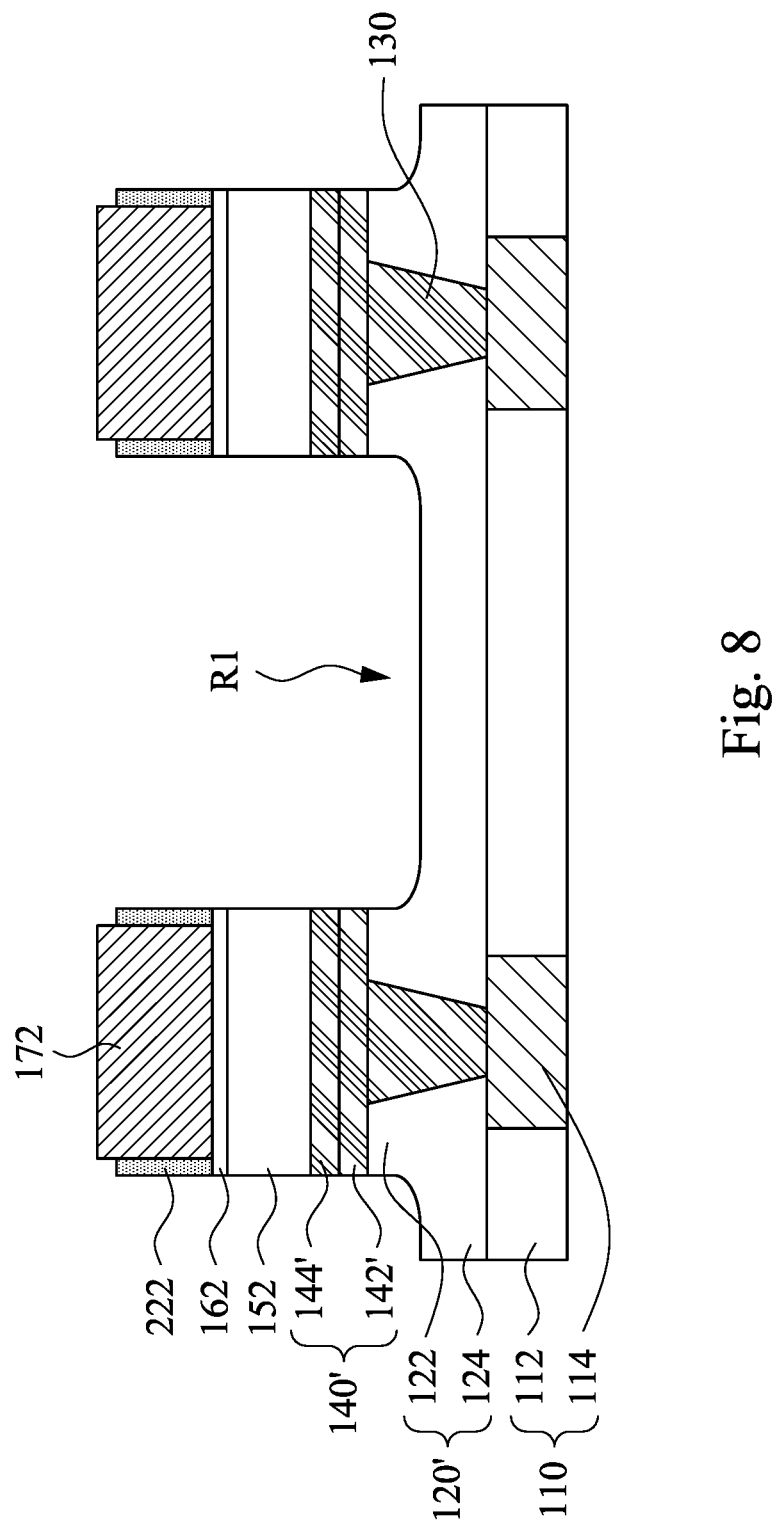

Reference is then made to FIG. 8. A physical etching process is performed to the structure of FIG. 7, thereby patterning the layers 142 and 144 of the bottom electrode layer 140 (referring to FIG. 7) respectively into the electrodes 142' and 144', which are in combination referred to as bottom electrodes 140'. The physical etching process may include an IBE process. The IBE process may remove horizontal portions of the bottom electrode layer 140 (referring to FIG. 7) exposed by the metal-containing compound masks 182 (referring to FIG. 7), and remove the metal-containing compound masks 182. In some embodiments, the incident angle of the IBE process may control such that the IBE process may slightly etch sidewalls of the resistance switching elements 152, the capping layers 162, and the protection spacers 222. Through the configuration, the IBE process may remove damaged portions and oxidized portions of the MTJ sidewalls (i.e., sidewalls of resistance switching elements 152) caused during the MICP or by exposing the MTJ sidewall (i.e., sidewalls of resistance switching elements 152) to the atmosphere, thereby physically cleaning the sidewalls of the resistance switching elements 152 without the need for an additional step. In some embodiments, the IBE process is performed within a range of about 0 degree to about 10 degrees for vertical etch. The IBE process may also reduce critical dimension (CD) of devices.

In absence of the protection spacers 222, during IBE, the ion beam may remove a portion of the top electrode and cause a material of the top electrode to re-deposition onto the sidewalls of the resistance switching elements 152. Consequently, this may short the MTJ structure (i.e., the MTJ stack and top and bottom electrodes) and deteriorate performance of the memory device. In the present embodiments, the protection spacers 222 protect sidewalls of the top electrodes 172, thereby preventing the top electrodes 172 from being removed by the IBE process, which in turn will avoid the redeposition issues. After the IBE process, the protection spacers 222 may be thinned.

The IBE process may have an end point detection system to allow the etching process to stop when the top electrodes 172 and the dielectric layer 120 are both exposed. In some embodiments, portions of the dielectric layer 120 not protected by the metal-containing compound masks 182 (referring to FIG. 7) are also etched, and recesses R1 are formed in the remaining dielectric layer 120'. The remaining dielectric layer 120' includes portions 122 and portions 124. A height of the portions 122 is greater than that of the portion 124. For example, a top end of the portions 122 is higher than that of the portions 124. The portions 122 surround the BEVAs 130, respectively. In some embodiments, a top end of the portions 122 is leveled up with the top surface of the BEVAs 130.

In the present embodiments, the chemical etching process is performed to pattern the resistance switching layer 150 (referring to FIG. 6) into the resistance switching elements 152, and then the physical etching process is performed to pattern the bottom electrode layer 140 (referring to FIG. 7) into the bottom electrodes 140' and clean sidewalls of the resistance switching elements 152. Etch rate of the chemical etching process (e.g., MICP) is faster than the physical etching process (e.g., IBE). Thus, the fabrication process can achieve better throughput than using pure physical etching process (e.g., IBE) to pattern both the resistance switching layer 150 and the bottom electrode layer 140 (referring to FIG. 6). In some alternative embodiments, a physical etching process (e.g., IBE) may be purely performed to pattern the resistance switching layer 150 and the bottom electrode layer 140 (referring to FIG. 6) into the resistance switching elements 152 and the bottom electrodes 140' without the need of a chemical etching process, in which the protection spacers 222 may also protect sidewalls of the top electrodes 172 from being removed during the physical etching process.

Figure 9:
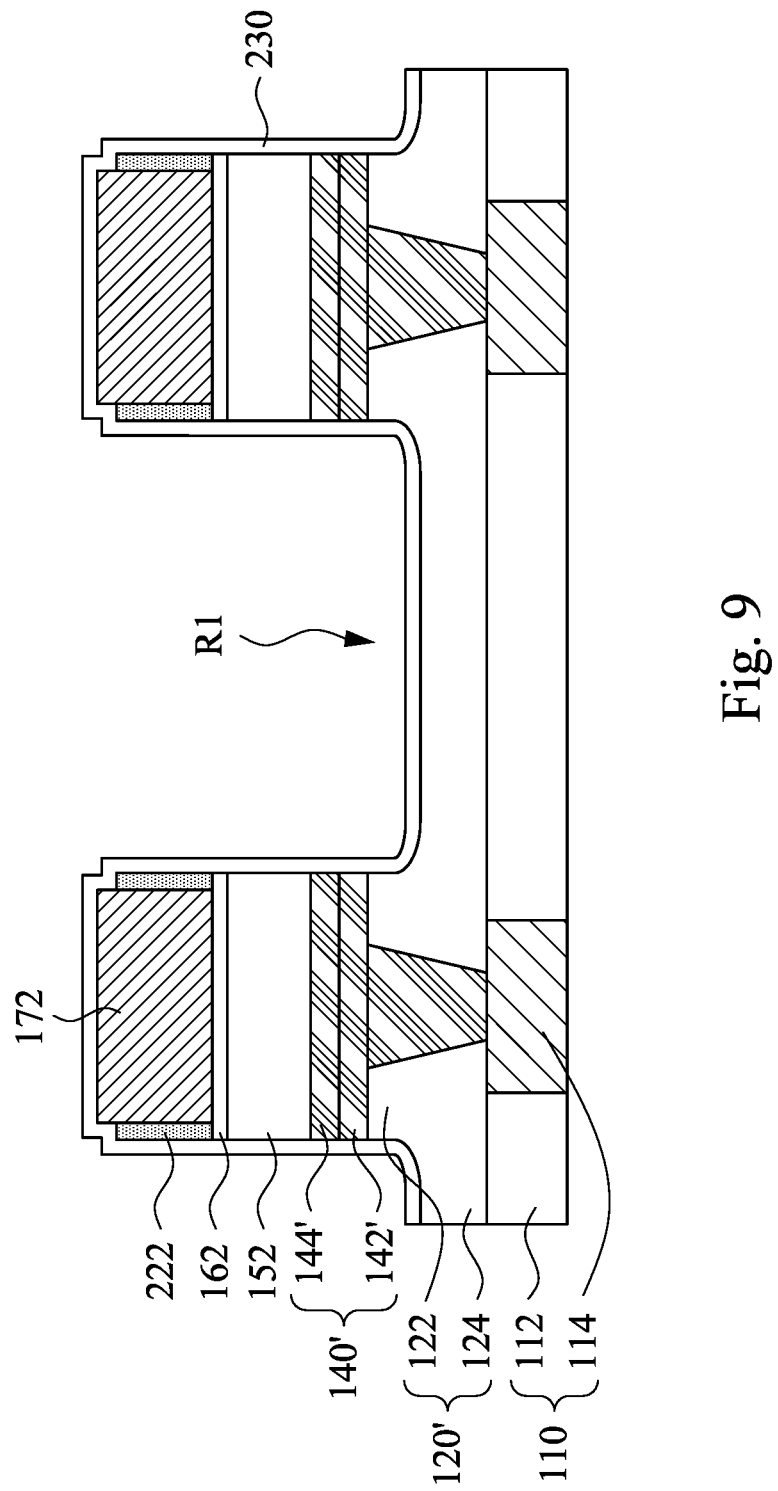

Reference is made to FIG. 9. A spacer layer 230 is in-situ blanketly deposited over the structure of FIG. 8. Material of the spacer layer 230 may be selected to protect the resistance switching elements 152 without influencing the function of the resistance switching elements 152. The spacer layer 230 may include suitable dielectric materials, such as silicon nitride, silicon carbide, carbon-doped silicon nitride, carbon-doped silicon oxide, silicon oxynitride, other suitable materials, and combinations thereof. Through the configuration, following the physical cleaning process in FIG. 8, the MTJ stack is encapsulated by the spacer layer 230 without breaking vacuum, such that the MTJ stack may have little or no sidewall damage layer.

Figure 10:
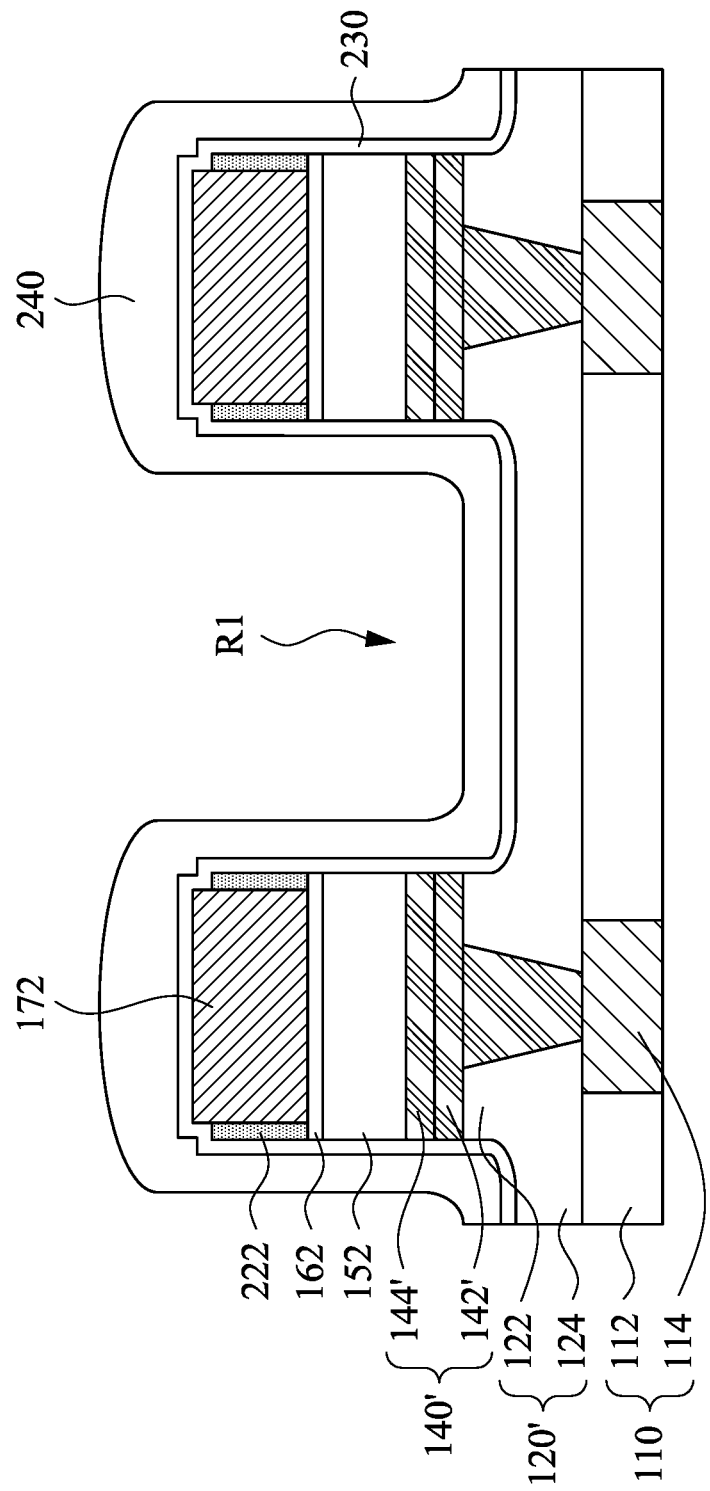

Reference is then made to FIG. 10. A spacer layer 240 is deposited over the structure of FIG. 9. The spacer layer 240 may include suitable dielectric materials such as silicon nitride, silicon carbide, carbon-doped silicon nitride, carbon-doped silicon oxide, silicon oxynitride, other suitable materials, and combinations thereof. The spacer layer 240 may include the same material as that of the spacer layer 230. In some embodiments, the spacer layer 240 may also be a composite layer including two or more layers made of different materials, such as a silicon nitride/silicon carbide stack. The spacer layer 240 may be formed using CVD, PVD, ALD, the like, and/or combinations thereof. In some embodiments, the spacer layer 240 is deposited at a higher temperature than that of the deposition of the spacer layer 230, such that the spacer layer 240 has a greater density than that of the spacer layer 230.

Figure 11A:
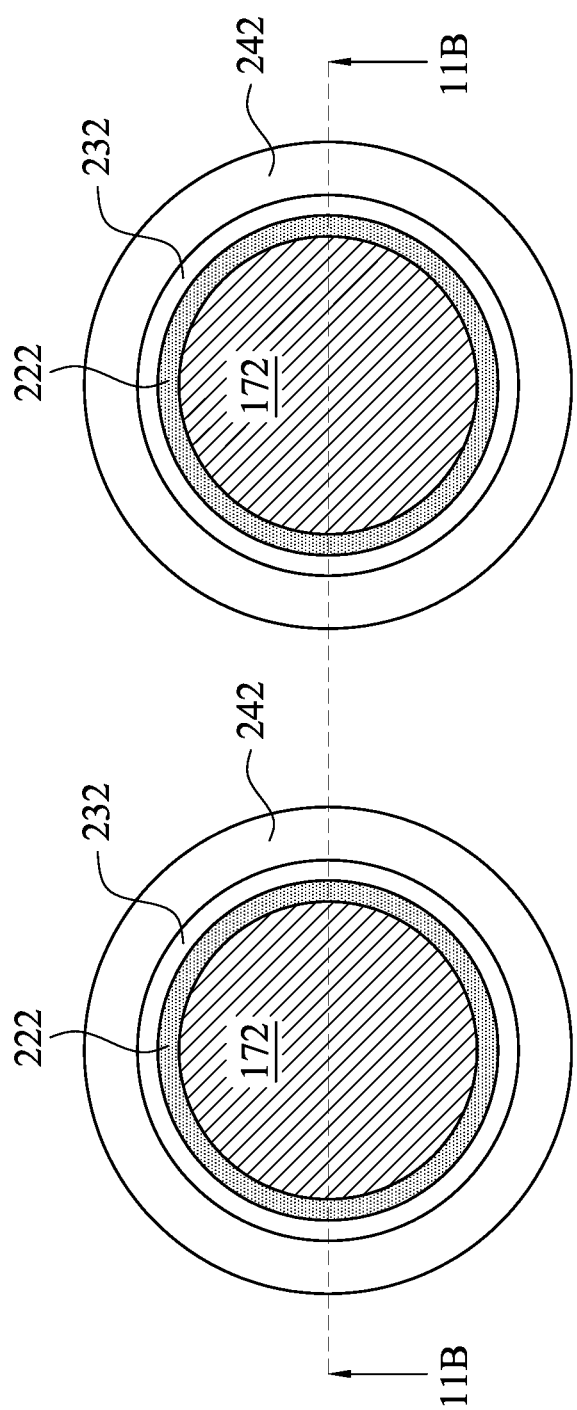
Figure 11B:
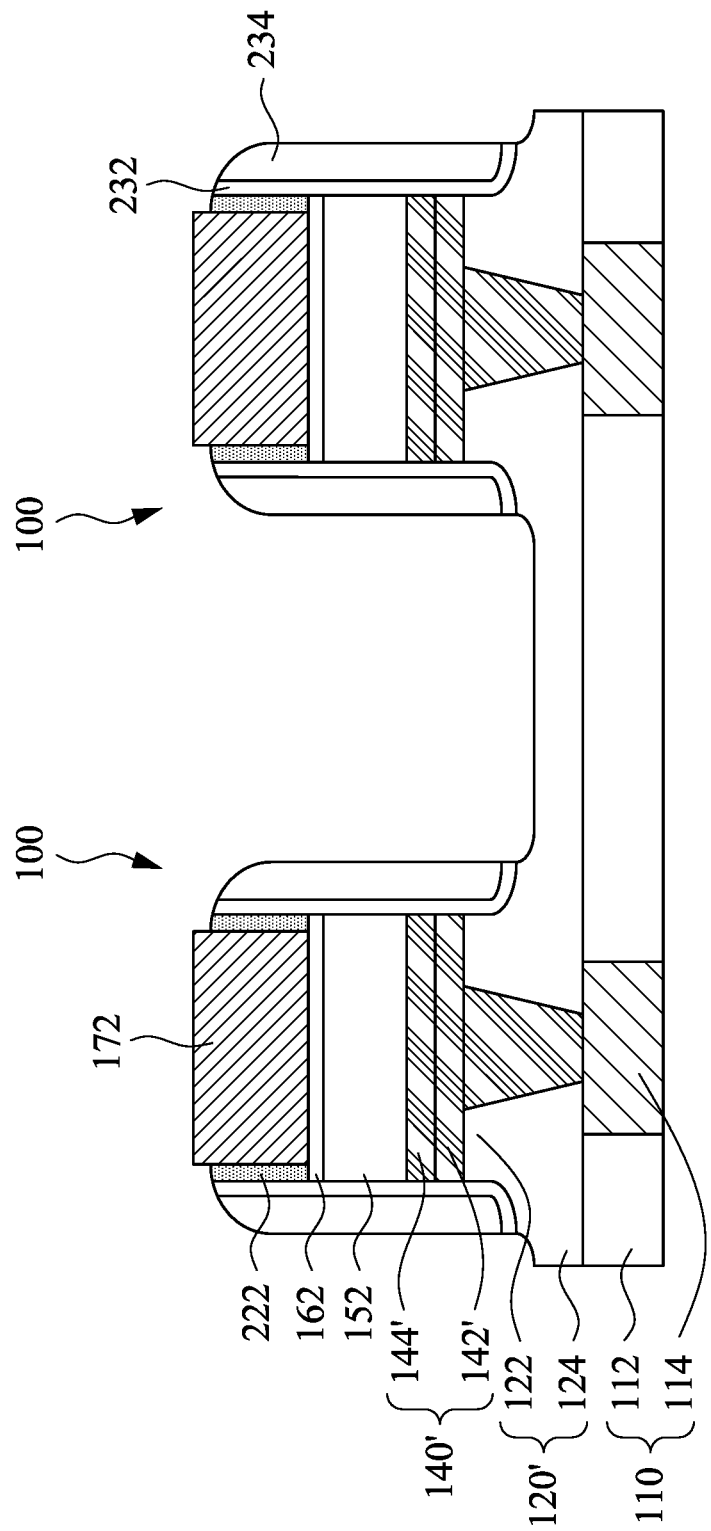

Reference is then made to FIGS. 11A and 11B. FIG. 11B is a cross-sectional view taken along line 11B-11B of FIG. 11A. The spacer layers 230 and 240 (referring to FIG. 10) are patterned into spacers 232 and 234, respectively. The patterning process may include a dry anisotropic etching, wet etching, or a combination thereof. In some embodiments where the spacer layers 230 and 240 are made of silicon nitride, the patterning of the silicon nitride layer includes a dry etching using $CH_2F_2$, $CF_4$, $CH_xF_y$, $CHF_3$, $CH_4$, $N_2$, $O_2$, Ar, He, as an etchant, although other applicable etchants may be used. For example, in some embodiment, the etching process is performed remove horizontal portions of the spacer layers 230 and 240 (referring to FIG. 9) while remaining vertical portions of the spacer layers 230 and 240 (referring to FIG. 9) around the resistance switching elements 152. The remaining portions of the spacer layers 230 and 240 (referring to FIG. 9) can be respectively referred to as spacers 232 and 242.

Referring to FIG. 11B, plural memory devices 100 are formed. Each of the memory devices 100 includes a bottom electrode 140', a resistance switching element 152, a capping layer 162, a top electrode 172, and a protection spacer 222. The protection spacer 222 is on a sidewall of the top electrode 172 and spaced apart from a sidewall of the resistance switching element 152. In some embodiments, a bottom surface of the protection spacer 22 is over a top surface of the resistance switching element 152. In some embodiments, a top surface of the protection spacer 222 is lower than a top surface of the top electrode 172. The memory devices 100 may further include spacers 232 and 242. Each of the spacers 232 is on the sidewall of the resistance switching elements 152 and the sidewall of the protection spacers 222.

Figure 12:
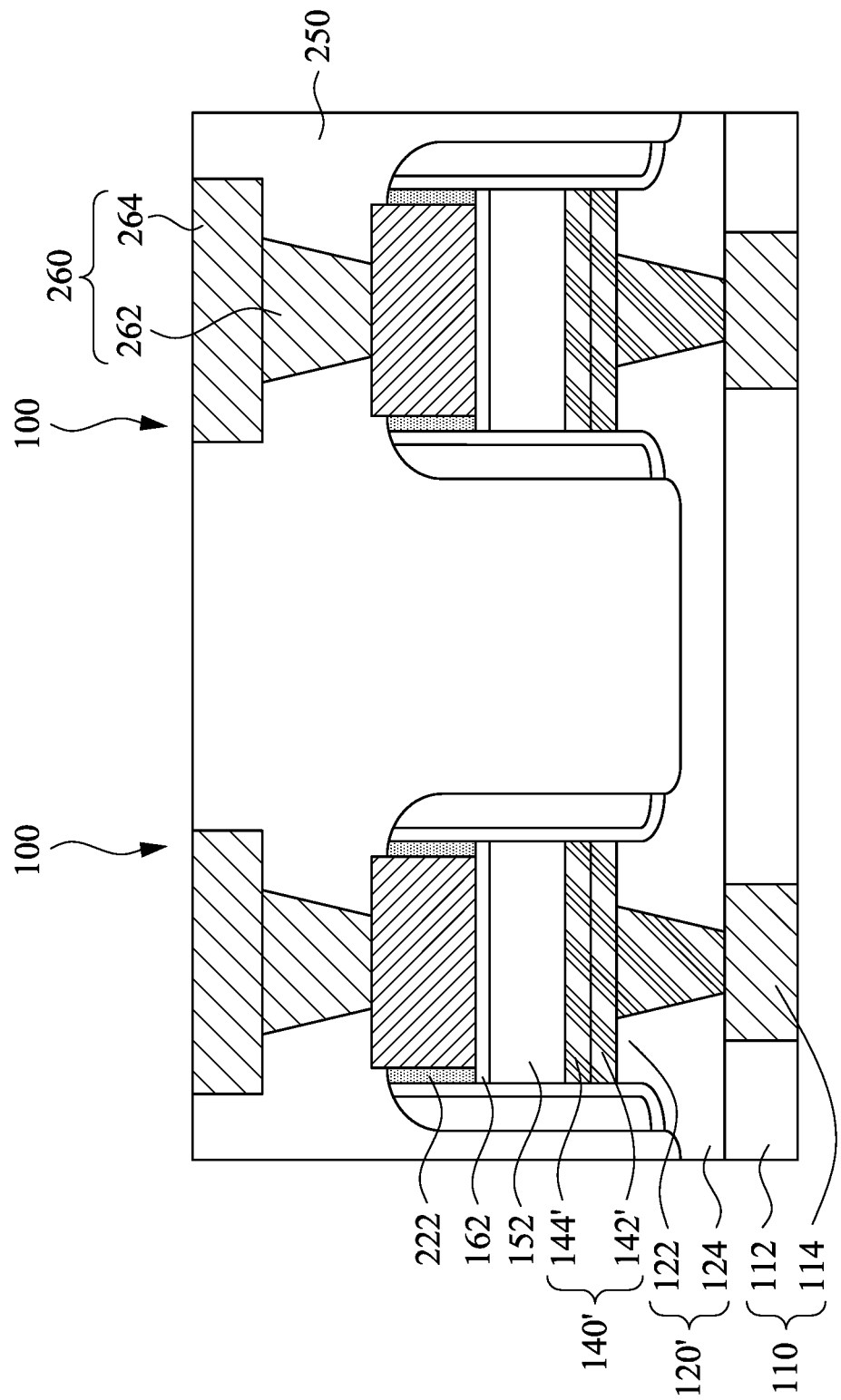

Reference is then made to FIG. 12. An ILD layer 250 is formed over the structure of FIG. 11B. In some embodiments, the ILD layer 250 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The material of ILD layer 250 may be the same as or different from the ILD layer 112.

A metallization pattern 260 is then formed in the ILD layer 250. The metallization pattern 260 may include conductive vias 262 and a metal layer 264. Formation of the metallization pattern 260 may be formed by etching openings and trenches in the ILD layer 250, and then filling one or more metals (e.g., copper) in the openings and trenches to form the metallization pattern 260. In some embodiments where the ILD layer 250 is silicon oxide, the etchant used in etching the openings and trenches can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. In some embodiments, the top electrodes 172 may has a higher etch resistance to the etching the openings and trenches than that of the ILD layer 250, such that the etching the openings may stop at the top electrodes 172 and not damage the underlying layers. After the openings and trenches are filled with metals, a planarization is performed to remove an excess portion of the metals outside the openings, and therefore the metallization pattern 260 is formed.

Figure 13:
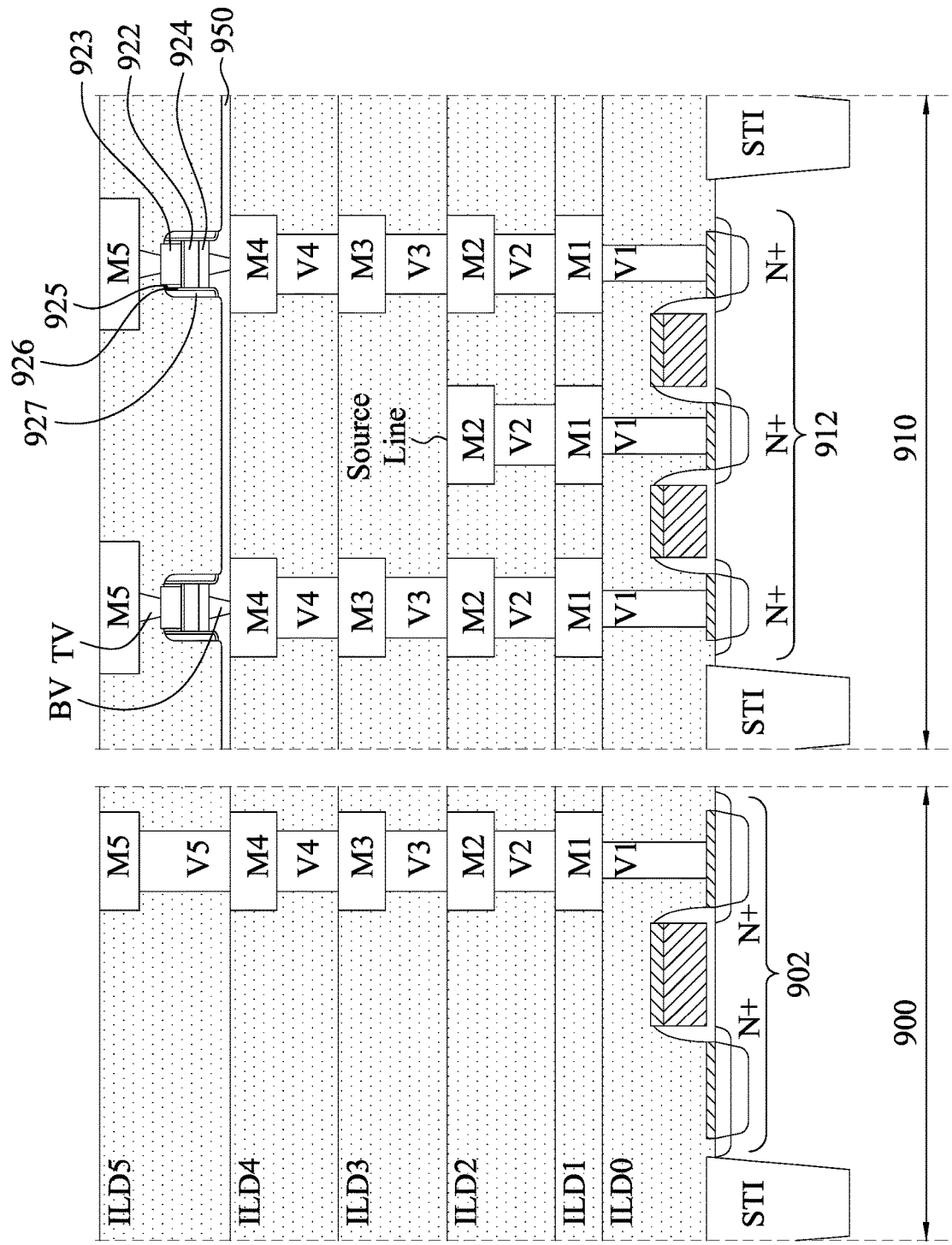
FIG. 13 is a cross-sectional view of an integrated circuit in accordance with some embodiments of the present disclosure.

FIG. 13 illustrates an integrated circuit including MRAM devices and logic devices. The integrated circuit includes a logic region 900 and a MRAM region 910. Logic region 900 may include circuitry, such as the exemplary transistor 902, for processing information received from MRAM devices 920 in the MRAM region 910 and for controlling reading and writing functions of MRAM devices 920. In some embodiments, the MRAM device 920 includes an MTJ stack 922, a top electrode 923 over the MTJ stack 922, and a bottom electrode 924 under the MTJ stack 922. The MRAM device 920 further includes protection spacers 925 surrounding the top electrode 923. The MRAM device 920 further includes spacers 926 and 927 surrounds the top electrode 923, the MTJ stack 922, and the bottom electrode 924.

As depicted, the integrated circuit is fabricated using six metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with the interconnect V1 connecting the stack to a source/drain contact of logic transistor 902. The MRAM region 910 includes a full metallization stack connecting MRAM devices 920 to transistors 912 in the MRAM region 910, and a partial metallization stack connecting a source line to transistors 912 in the MRAM region 910. MRAM devices 920 are depicted as being fabricated in between the top of the metallization layer M4 and the bottom of the metallization layer M5. The metallization layer M4 is connected with the bottom electrode 924 through a bottom via BV in a dielectric layer 950, and the metallization layer M5 is connected with the top electrode 923 through a top via TV in the ILD5. Six ILD layers, identified as ILD0 through ILD5 are depicted in FIG. 13 as spanning the logic region 900 and the MRAM region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the protection spacer protects the sidewall of the top electrode, thereby avoiding a conductive material of the top electrode from re-deposited on a sidewall of the MTJ stack during the IBE process. Another advantage is that a metal-containing compound layer is used as a robust etch mask during etching MTJ layer, thereby reducing a critical dimension of the MTJ structure.

According to some embodiments of the present disclosure, a method for manufacturing a memory device is provided. The method includes forming a bottom electrode layer, a resistance switching element layer over the bottom electrode layer, and a top electrode layer over the resistance switching element layer; patterning the top electrode layer into a top electrode; forming a protection spacer on a sidewall of the top electrode; patterning the resistance switching element layer into a resistance switching element after forming the protection spacer; and patterning the bottom electrode layer into a bottom electrode after patterning the resistance switching element layer.

According to some embodiments of the present disclosure, a method for manufacturing a memory device is provided. The method includes forming a bottom electrode layer, a resistance switching element layer over the bottom electrode layer, and a top electrode layer over the resistance switching element layer; forming a metal-containing compound mask over the top electrode layer; removing a portion of the top electrode layer uncovered by the metal-containing compound mask to form a top electrode; removing a portion of the resistance switching element layer uncovered by the metal-containing compound mask to form a resistance switching element; and performing an etching process to remove the metal-containing compound mask from the top electrode and patterning the bottom electrode layer into a bottom electrode.

According to some embodiments of the present disclosure, a memory device includes a bottom electrode, a resistance switching element, a top electrode, and a protection spacer. The resistance switching element is over the bottom electrode. The top electrode is over the resistance switching element. The protection spacer is on a sidewall of the top electrode. A bottom surface of the protection spacer is over a top surface of the resistance switching element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, the method comprising:
    forming a bottom electrode layer, a resistance switching element layer over the bottom electrode layer, and a top electrode layer over the resistance switching element layer;
    forming a metal-containing compound mask over the top electrode layer;
    patterning the top electrode layer into a top electrode;
    depositing a protection spacer layer over the metal-containing compound mask, the top electrode, and the resistance switching element layer, wherein at least a portion of a bottom surface of the protection spacer layer is in contact with a top surface of the metal-containing compound mask;
    patterning the protection spacer layer to form a protection spacer on a sidewall of the top electrode;
    patterning the resistance switching element layer into a resistance switching element after forming the protection spacer; and
    patterning the bottom electrode layer into a bottom electrode after patterning the resistance switching element layer.

2. The method of claim 1, wherein patterning the bottom electrode layer comprises performing a physical etching process to the bottom electrode layer, and the protection spacer protects the sidewall of the top electrode from being removed during the physical etching process.

3. The method of claim 1, wherein patterning the resistance switching element layer comprises performing a chemical etching process to the resistance switching element, and the protection spacer protects the sidewall of the top electrode from being exposed during the chemical etching process.

4. The method of claim 1, wherein patterning the protection spacer layer comprises performing an ion beam etching process to the protection spacer layer.

5. The method of claim 1, wherein the protection spacer is made of a metal-containing compound material.

6. The method of claim 1, further comprising:
forming a dielectric spacer on a sidewall of the bottom electrode, a sidewall of the resistance switching element, and a sidewall of the protection spacer.

7. The method of claim 1, wherein patterning the protection spacer layer is performed such that the protection spacer is further on a sidewall of the metal-containing compound mask.

8. The method of claim 1, wherein patterning the bottom electrode layer is performed such that at least a portion of the metal-containing compound mask is removed.

9. The method of claim 1, wherein the bottom electrode layer serves as an etch stop layer during patterning the resistance switching element layer, and the metal-containing compound mask serves as an etch mask during patterning the resistance switching element layer.

10. The method of claim 3, wherein the chemical etching process comprises a magnetized inductively coupled plasma (MICP) etch process.

11. A method for manufacturing a memory device, the method comprising:
forming a bottom electrode layer, a resistance switching element layer over the bottom electrode layer, and a top electrode layer over the resistance switching element layer;
forming a metal-containing compound mask over the top electrode layer;
removing a portion of the top electrode layer uncovered by the metal-containing compound mask to form a top electrode;
performing a chemical etching process to remove a portion of the resistance switching element layer to form a resistance switching element, wherein the chemical etching process uses the metal-containing compound mask as an etch mask and uses the bottom electrode layer as an etch stop layer; and
performing a physical etching process to remove the metal-containing compound mask from the top electrode and pattern the bottom electrode layer into a bottom electrode.

12. The method of claim 11, wherein the physical etching process is an IBE process.

13. The method of claim 11, further comprising:
forming a dielectric spacer layer on a sidewall of the bottom electrode, a sidewall of the resistance switching element, and a top surface of the top electrode.

14. The method of claim 11, further comprising:
forming a protection spacer on a sidewall of the top electrode and a sidewall of the metal-containing compound mask prior to the chemical etching process.

15. The method of claim 14, wherein the physical etching process is performed such that a portion of the protection spacer on the sidewall of the metal-containing compound mask is removed.

16. A method for manufacturing a memory device, the method comprising:
forming a bottom electrode layer over a semiconductor substrate, a resistance switching element layer over the bottom electrode layer, and a capping layer over the resistance switching element layer;
forming a top electrode over the capping layer;
depositing a protection spacer layer over a top surface of the capping layer and a sidewall of the top electrode;
etching the protection spacer layer into a protection spacer; and
patterning the resistance switching element layer and the bottom electrode layer respectively into a resistance switching element and a bottom electrode below the top electrode and the protection spacer, wherein after the patterning, a top end of the protection spacer is below a top surface of the top electrode.

17. The method of claim 16, wherein etching the protection spacer layer is performed such that a top surface of the resistance switching element is covered by the capping layer.

18. The method of claim 16, wherein etching the protection spacer layer comprises an IBE process.

19. The method of claim 16, further comprising:
forming a dielectric layer over the semiconductor substrate; and
forming a bottom electrode via in the dielectric layer prior to forming the bottom electrode layer, the resistance switching element layer, and the capping layer, wherein patterning the resistance switching element layer and the bottom electrode layer is performed such that a recess is formed in the dielectric layer.

20. The method of claim 16, wherein patterning the resistance switching element layer and the bottom electrode layer comprises an IBE process.

* * * * *